(12) United States Patent
Van Montfort et al.

(10) Patent No.: US 8,525,397 B2
(45) Date of Patent: Sep. 3, 2013

(54) OLED DEVICES WITH PROTECTION COVER

(75) Inventors: Vincent Johannes Jacobus Van Montfort, Sittard (NL); Tom Munters, Hasselt (BE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/393,670

(22) PCT Filed: Sep. 7, 2010

(86) PCT No.: PCT/IB2010/054015
§ 371 (c)(1),
(2), (4) Date: Mar. 1, 2012

(87) PCT Pub. No.: WO2011/030283
PCT Pub. Date: Mar. 17, 2011

(65) Prior Publication Data
US 2012/0161603 A1    Jun. 28, 2012

(30) Foreign Application Priority Data
Sep. 11, 2009  (EP) .................................. 09170010

(51) Int. Cl.
*H01J 1/70*    (2006.01)
*H01J 7/24*    (2006.01)

(52) U.S. Cl.
USPC ............................ 313/112; 313/505; 313/506

(58) Field of Classification Search
USPC .............................................. 313/495–512
See application file for complete search history.

(56) References Cited

U.S. PATENT DOCUMENTS

| | | | | |
|---|---|---|---|---|
| 3,110,837 A | * | 11/1963 | Wollentin | 313/512 |
| 4,593,228 A | * | 6/1986 | Albrechtson et al. | 313/509 |
| 5,246,789 A | * | 9/1993 | Itani et al. | 428/690 |
| 5,496,427 A | | 3/1996 | Gustafson et al. | |
| 5,693,956 A | | 12/1997 | Shi et al. | |
| 6,201,346 B1 | | 3/2001 | Kusaka | |
| 7,189,999 B2 | * | 3/2007 | Yamazaki et al. | 257/72 |
| 7,453,089 B2 | * | 11/2008 | Yamazaki et al. | 257/72 |
| 7,495,644 B2 | * | 2/2009 | Hirakata | 345/92 |

(Continued)

FOREIGN PATENT DOCUMENTS

| | | |
|---|---|---|
| TW | 253875 B1 | 4/2006 |
| WO | 2008012460 A2 | 1/2008 |
| WO | 2008115513 A1 | 9/2008 |
| WO | 2008151009 A1 | 12/2008 |

*Primary Examiner* — Anh Mai
*Assistant Examiner* — Elmito Breval
(74) *Attorney, Agent, or Firm* — David Zivan; Mark Beloborodov (57) ABSTRACT

The invention relates to an OLED device (1) comprising a light emitting layer stack (3) on top of a substrate (2) encapsulated by an encapsulating cover (4), where at least the edges of the substrate (2) and the encapsulating cover (4) are covered with a protection cover (5) made of a moldable material and to an OLED system (10) comprising at least one OLED device (1) and at least one electronic board (81, 82) connected to the at least one OLED device (1) by suitable connectors (85), preferably further comprising a cooling body (9) thermally connected to the OLED device (1). The invention further relates to a method to manufacture an OLED device (1) or an OLED system (10) comprising the step of applying a protection cover (5) to the OLED device (1) or the OLED system (10) by a plastic molding technique to at least partly cover the OLED device (1) or the OLED system (10).

14 Claims, 3 Drawing Sheets

(56) References Cited

U.S. PATENT DOCUMENTS

| | | |
|---|---|---|
| 2001/0026125 A1* | 10/2001 | Yamazaki et al. ............ 313/505 |
| 2001/0033135 A1* | 10/2001 | Duggal et al. ................ 313/506 |
| 2002/0053871 A1* | 5/2002 | Seo ............................... 313/504 |
| 2002/0068191 A1* | 6/2002 | Kobayashi .................... 428/690 |
| 2002/0113548 A1 | 8/2002 | Silvernail |
| 2005/0070976 A1* | 3/2005 | Samuel et al. .................. 607/88 |
| 2005/0088088 A1* | 4/2005 | Yamazaki ..................... 313/512 |
| 2006/0290276 A1* | 12/2006 | Cok et al. ..................... 313/512 |
| 2008/0117519 A1 | 5/2008 | Chari et al. |
| 2009/0009063 A1* | 1/2009 | Botelho et al. ................ 313/504 |

* cited by examiner

OLED DEVICES WITH PROTECTION COVER

FIELD OF THE INVENTION

This invention relates to an OLED device with a protection cover made of a moldable material, a corresponding OLED system with at least one of these OLED devices and a method to manufacture such OLED devices and OLED systems.

BACKGROUND OF THE INVENTION

Organic light emitting devices (OLED devices) comprise a layer stack on top of a substrate with at least one light emitting layer arranged between two electrodes to apply a driving voltage to the light emitting layer(s). OLED devices typically comprise glass substrates and an encapsulation (a cover lid) for protection against environmental atmospheres, typically another glass plate. Glass plates have sharp edges, which could be a protection issue during handling and are fragile when exposed to mechanical loads, especially for large area OLED devices. Furthermore, the glass plates (substrate and/or cover lid) make it difficult to apply conventional fastening methods such as screwing, clamping, drilling etc. to mount the OLED devices to any desired location, e.g. on walls.

SUMMARY OF THE INVENTION

It is an object of the present invention to provide an OLED device and a corresponding OLED system with improved mechanical loading capacity and reduced risk of injuries during handling of the OLED devices and OLED systems.

The object is solved by an OLED device comprising a light emitting layer stack on top of a substrate encapsulated by an encapsulating cover, where at least the edges of the substrate and the encapsulating cover are covered with a protection cover made of moldable material. Non-covered edges of substrate and encapsulating cover may cause cutting damages to operators during device handling. The protection cover directly deposited at least over all sharp edges enables a save handling and the risk of injuries is significantly reduced, especially when the substrate, preferably the substrate and the encapsulating cover, are made of glass, preferably a flat plate of glass. A present protection cover further improves the mechanical robustness of the OLED device against mechanical loads, especially against side impacts acting on the parts of the OLED device, where the protection cover is present. The term "moldable material" denotes any material, which can be applied directly onto the substrate and encapsulating cover with molding and/or casting techniques such as injection molding, extrusion molding, thermosetting compression molding and casting. Molding is a process of manufacturing by shaping pliable raw material using a rigid frame, in which the material is hardened to form a rigid body. Casting is a manufacturing process by which a liquid material is usually poured into a form (mold), which contains a hollow cavity of the desired shape and then allowed to solidify to form a rigid body.

The protection cover is advantageous over common OLED housings, because common housings only carry the OLED devices without mechanically stabilizing the fragile parts of the OLED device itself. Housings may provide a mechanical encapsulation around the OLED but without being in direct contact to the OLED device on the full housing area. Mechanical impacts therefore act also on the OLED device inside the housing and eventually damage the OLED device, since the mechanical robustness of the OLED device itself is not improved. OLED devices inserted in housings are hold, but housings do not take the OLED device directly under seal like the protection cover do. In contrast to OLED housings, the protection cover is permanently and directly fixed to the OLED device. A direct contact of the protection cover to the substrate and encapsulation enables heat dissipation away from the light emitting layer stack. This is not possible with a common OLED housing.

The protection cover may have any optical appearance such as a transparent, partly transparent or opaque appearance. In case of partly transparent or opaque protection covers, the light emitting surfaces of the OLED should not be covered in order not to decrease the brightness of the OLED device. The protection cover may fully cover the encapsulating cover in addition to the edges of substrate regardless of the optical appearance, if the light will be emitted through the substrate of the OLED device. Such a rigid protection cover significantly improves the mechanical robustness of the OLED device against mechanical loads. A protection cover at least covering the encapsulating cover, usually the back side of the OLED device, enables an easier use of conventional fastening means such as holes, screwholes, clickfingers or edges to fasten the OLED devices to any desired location. These fastening means can be integrated into the protection cover and/or applied to the protection cover. A non transparent protection cover may comprise desired colors and/or structures not influenced by the OLED on/off status (light emitting/non-emitting).

The encapsulating cover protects the light emitting layer stack against environmental atmosphere to provide OLED devices with sufficient life time. The material of the encapsulating cover may be any gastight material sealed on top of the substrate, usually on areas at least partly covered with the substrate electrode. The encapsulating cover might be sealed to the substrate with glass frits providing a gastight junction between substrate and encapsulating cover or bonded or glued on top of the substrate. In alternative embodiments, the encapsulation cover may be applied as a gastight thin film layer stack directly applied on top of the light emitting layer stack, preferably a flexible layer stack. The protection cover fully enclosing the encapsulating cover acts as an additional gas barrier improving the quality of the total encapsulation against the environmental atmosphere.

The light emitting layer stack at least comprises one organic light emitting layer arranged between two electrodes, where the electrode arranged on the substrate side of the stack is denoted as substrate electrode and the other electrode arranged on top of the layer stack is denoted as back electrode. The layer stack arranged between both electrodes may comprise additional organic and/or inorganic layers such as further organic light emitting layers, hole and/or electron injection layers, hole and/or electron transport layers, hole and/or electron blocking layers, intermediate electrodes etc. The layer stack may comprise structured and/or non-structured layers. The OLED device may comprise a pixelated light emitting structure. A layer is denoted as structured, if the layer covers only a part of the area occupied by the light emitting layer stack. The light emitting layer stack may be applied directly on top of the substrate. Alternatively, additional layers may be arranged between substrate electrode and substrate, for example to improve and/or modify the light outcoupling and/or the color of the emitted light. Both electrodes may act as cathode or respectively as anode. To emit light, the OLED device requires at least one transparent electrode, typically consisting of a conductive transparent oxide such as Indium-Tin-Oxide (ITO). The other electrode can be transparent or reflective. Reflective electrodes are typically made of metal layers, e.g. Aluminum. The OLED device provides at least two electrically separated contact areas outside the encapsulating cover connected with substrate electrode and back electrode. The protection cover may cover also these contact areas, which have to be cleaned before being able to apply a driving voltage to the light emitting layer stack. Alternatively, the protection cover will not cover these contact areas prepared by a correspondingly adapted molding or casting process, where the areas not to be coated are masked or shielded. OLED devices can have different shapes, for example a strip-like or sheet-like shape or a two-dimensional or three-dimensional freeform.

In an embodiment the moldable material of the protection cover is plastic, preferably polyurethane, silicones, epoxies, polymethylmethacrylate (PMMA), polycarbonate and acrylic based plastics. The organic layers within the light emitting layer stack are sensitive to high temperatures. Operating temperatures of 80-120° C. are sufficiently low to provide OLED devices with a lifetime of more than 10000 h. Temperatures significantly above 120° C. applied for a longer time period would have a negative effect on the lifetime of the OLED device. The temperatures of the molding process are only applied for a much shorter time period. However, temperatures of the molding process of more than 250° C. should be avoided to obtain the same good lifetime performance. The materials listed above are suitable material examples for molding processes at low pressures and low temperatures maintaining a sufficient lifetime of the OLED devices.

In another embodiment the protection cover is at least partly transparent. The term "partly" relates to OLED devices comprising non-opaque protection covers and/or protection covers, where at least one part of the protection cover is transparent. An example of a transparent protection cover is a cover made of transparent plastics such as polyurethane, silicones, epoxies, polymethylmethacrylate, polycarbonate and acrylic based plastics. A transparent protection cover is suitable not only to cover the edges of the substrate and the encapsulating cover but also the light emitting surfaces of the OLED device in contrast to non-transparent protection covers, where the light-emitting surfaces must not be covered, e.g. by shielding these surface during applying the protection cover. Typically, an OLED device emits light through its substrate comprising a reflective back-electrode (so-called bottom emitter), but the OLED device may have an inverted structure, where the substrate is reflective and/or the substrate electrode is reflective. Such OLED devices emit light through the transparent back electrode and the transparent encapsulating cover (so-called top emitter). In this case the protection cover covering the encapsulation cover has to be at least partly transparent, preferably transparent. In another embodiment, the OLED device may comprise transparent substrate electrode and back electrode as well as transparent substrate and encapsulating cover emitting light to both sides (so-called transparent OLED). A transparent protection cover is suitable to cover the light emitting surfaces (substrate and/or encapsulating cover) without decreasing the brightness of the OLED device. A protection cover fully enclosing the substrate and the encapsulating cover, preferably while providing at least two non-covered electrical connection to operate the OLED device, further improves the mechanical robustness of the OLED device against mechanical loads compared to a partial coverage of the OLED device with the protection cover. A protection cover with a thickness of more than 3 mm, preferably more than 4 mm, more preferred more than 6 mm, fully enclosing the OLED device provides a device essentially non-sensitive to mechanical loads enabling applications such as floor lighting, where heavy mechanical loads may occur.

In an embodiment the moldable material comprises first additives to achieve optical effects. Here the moldable material is at least partly transparent. The achieved optical effects comprise light scattering (via embedded scattering particles as first additives), local re-directing of light (e.g. via embedded micro lenses as first additives), varying of the color of the emitted light locally or temporary (via embedded phosphor particles absorbing light of a first wavelength and re-emitting of light of a second wavelength longer than the first wavelength as first additives). Examples of first additives are metal particles (e.g. Al, Ti) or particles with a refractive index different to the refractive index of the transparent protection cover (e.g. TiO, SiO, SiN etc.) as scattering particles. In case of phosphor particles people skilled in the art are able to select suitable particles to convert a first wavelength in a desired second wavelength. Size and amount of particles have to be adjusted to achieve the desired effect. In typical OLED devices a certain amount of the generated light is captured within the transparent substrate due to total reflection effects caused by the refractive index transition from substrate material to air. The material of the protection cover may exhibit a refractive index of a value ranging between the refractive index of the substrate and air to lower the effects of total reflection. Also light still captured within the substrate propagating parallel to the substrate surface will enter the transparent material of the protection cover and can be used to illuminate other areas beside the emitting surface of the non-covered OLED device achieved by a suitable shape of the protection cover (light out-coupling structures) or by locally distributed scattering particles as first additives. Alternatively, first additives may lead to a reflection of the captured light back to the substrate with modified propagation direction leading to an increased light out-coupling from the substrate into air or the scattered light will be out-coupled from the protection cover to air at a position outside the substrate area. People skilled in the art may achieve additional or other optical effects by adding suitable additives with a certain concentration, size, shape and type to the protection cover still covered by the present invention.

In another embodiment the moldable material comprises second additives to increase the stiffness and/or the thermal conductivity of the protection cover with filler materials like: metal powder, carbon or silica particles. Herewith the term "second additives" comprise microscopic additives like particles or macroscopic additives like stiffening ribs or thicker full material for the molding process. An improved stiffness leads to a further improved mechanical robustness and mechanical loading capacity, especially desired for applications, where heavy object are positioned onto the OLED devices (permanently or temporarily) as the case for OLED devices in floor applications. Protection covers, especially protection covers fully enclosing the substrate and the encapsulating cover, with a suitable thermal conductivity can be utilized to cool the OLED device during operation. Since elevated operating temperatures might have a negative effect on the lifetime of the OLED device, such cooling via the protection cover will result in an increased lifetime of the OLED device or enables to operate the OLED at a higher driving voltage maintaining the same lifetime performance. For OLED devices normally being exposed directly to air or exhibiting small air gaps like the case in common OLED housings, the cooling effect is rather limited due to the low thermal conductivity of air. A protection cover with a suitable thermal conductivity can be contacted to a common heat sink component as present in many electronic devices resulting in an effective cooling of the OLED devices with the previously described advantages.

The invention further relates to an OLED system comprising at least one OLED device according to the present invention and at least one electronic board connected to the at least one OLED device by suitable connectors, preferably further comprising a cooling body thermally connected to the OLED device. Suitable electronic boards with suitable connectors enable the use of one or more OLED devices in series or in parallel or in a mixed configuration of serial and parallel connected OLED devices. The preferably present cooling body, e.g. a common heat sink, may be directly attached to the protection cover or be arranged beside the OLED device having a good thermal contact to the OLED devices, e.g. with metal stripes ranging at least from the protection cover to the cooling body. Good heat dissipation away from the OLED device will lead to an improved lifetime performance or drivability at higher voltages maintaining the same lifetime performance. The electronic board comprises driving controllers and/or driving sensors to adapt the driving controller to sensor specific parameters. Also rechargeable power sources (e.g. batteries) may be present. As an example, an OLED system may be used as a marker light having a rectangular carrier comprising electronic boards, OLED devices and suitable electrical connectors. The marker light may be a connectable module able to be scaled-up to a marker light strip of any desired length comprising several marker lights.

In an embodiment the electronic board and the suitable connectors of the OLED system are also at least partly covered by the protection cover. Here the OLED device, the electronics, interconnections, conductors and the mechanical carrier of these components can be manufactured as one part device covered with a protection cover in one step. The advantage to mold the OLED system in one step is the possibility to test the functionality of the OLED system before applying the protection cover ensuring, that only well functioning OLED are covered with the protection cover. In case of damaged components, the components may be replaced before applying the molding process. The protection cover covering the OLED device and/or the OLED system may have any suitable shape comprising all kinds of shapes like spheres, lenses or a three-dimensional freeform etc.

In an advantageous embodiment the protection cover fully encapsulates all components of the OLED system, preferably while providing suitable non-covered electrical contacts to connect the OLED system to a power source. Such a system provides one lighting system, which is mechanical robust and can be handled as one piece without particular. The term "components of the OLED systems" comprise all kind of components, especially electrical board such as drivers and/or sensors, connectors, OLED devices, cooling bodies etc. In another embodiment one of the components of the OLED system are stiffening ribs to improve the mechanical robustness of the OLED system.

This invention further relates to a method to manufacture an OLED device according to the present invention or an OLED system according to the present invention comprising the step of applying a protection cover to the OLED device or the OLED system by a plastic molding technique to at least partly cover the OLED device or the OLED system. For example plastic molding technique are injection molding, extrusion molding, thermosetting compression molding, which are typical thermoplastic/thermosetting processes requiring molten plastic at high temperatures and pressures ~250° C./>30 Bar In an embodiment the plastic molding technique is a low temperature and/or low pressure molding technique, preferably a casting process. As an example, casting is a process, where a material is casted in a form (mold). This process is an exothermic reaction. By selecting the right material, process temperature and process speed, the casting process can be tuned to a maximum process temperature of 60° C. With the OLED device lifetime performance is temperature dependent and therefore sensitive to high molding temperatures. The low temperature of the casting process will result in a better lifetime performance of the OLED device according to the present invention compared to other molding techniques. Additionally, the casting can be performed at atmosphere pressure and therefore very suitable to be applied to mold-in glass substrates and/or glass encapsulation covers. Several materials are applicable for casting, e.g. polyurethane as a typical casting plastic, which stiffness and hardness can be easily varied. But other materials such as silicones, epoxies and acrylic plastics could also be used for casting as well as for other molding techniques.

Casting is well known for molding-in electrical components to protect them against environmental conditions. Here, the casted protection cover also protects the OLED device against environmental atmospheres. OLED devices/systems require dedicated electronic drivers, driver controllers, electrically conductors and connectors etc. The easiest way to integrate these components into the OLED system is by placing these components close to the OLED device, which can be molded-in together with the components in the same one-step process providing one OLED system fully or partly coated with the protection cover.

In an embodiment of the method first and/or second additives are added to the moldable material before applying the step of applying the protection cover. These additives provide optical effects, increase the stiffness of the protection cover and/or provide a good thermal conductivity of the protection cover In another embodiment the method further comprises the step of shielding the light emitting surfaces of the OLED device in case of applying an opaque moldable material and/or the electrical contacts to connect the electrodes of the OLED device to a power source or to components of the OLED system in order not to be covered with the protection cover. In an alternative embodiment, the OLED device and/or the OLED system are fully enclosed by the protection cover, where the electrical contact are cleaned after molding-in the OLED device or OLED system, e.g. by laser ablation of the molded material.

The above discussed embodiments are only examples. Skilled people may consider modifications of said embodiments within the scope of this invention. More details of the invention are shown in the following figures and the detailed description of embodiments.

DETAILED DESCRIPTION OF EMBODIMENTS

Figure 1:
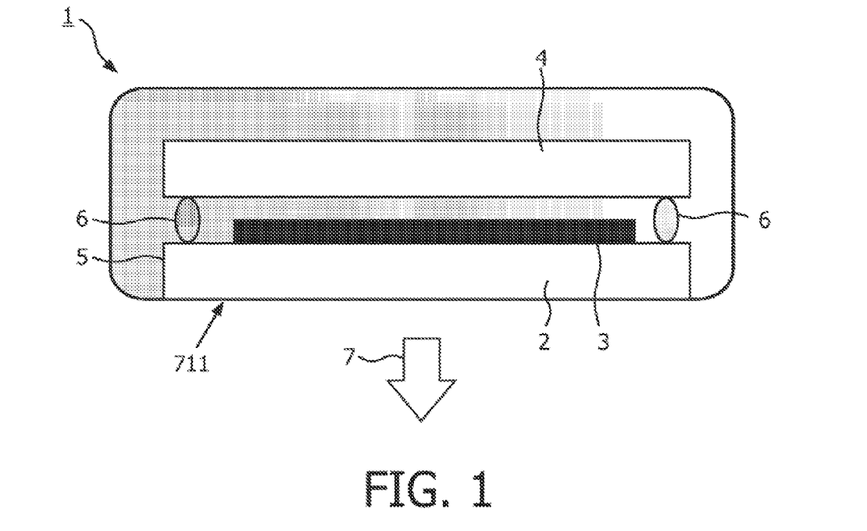
FIG. 1: OLED device according to the present invention partly coated with the protection cover in a side view

FIG. 1 shows an example of an OLED device 1 according to the present invention comprising a light emitting layer stack 3 arranged on top of a flat glass substrate 2. The light emitting layer stack 3 is encapsulated against the environmental atmosphere with a flat encapsulating glass cover 4, which is sealed to the substrate 2 with gastight glass frit 6. Substrate 2 and encapsulating cover 4 may have different shapes in other embodiments, also the material of the substrate and the encapsulating cover might be different. However, substrate 2 and encapsulating cover 4 have sharp edges causing a risk of injuries during handling and a risk of damages due to the fragile glass used from substrate and encapsulating cover. OLED devices are scalable and especially large area OLED light sources are desired to illuminate rooms etc. For large area OLED devices, the risk of damages will increase with increasing size of OLED device. The example shown in FIG. 1 is a so-called bottom emitter emitting light 7 through the substrate 2. The edges of the substrate 2 and the encapsulating cover 4 are covered by the protection cover 5 applied via molding techniques. In this embodiment the light emitting surface 711 of the substrate 2 is not coated. The coverage of the emitting surface 711 must be avoided in case of non-transparent (opaque) protection covers 5. However, for the same shape of the protection cover 5, also transparent materials can be used. The protection cover 5 is molded over the bare OLED device by placing the finished bare OLED device into a form subsequently filled with moldable material to provide the protection cover, where the light emitting surface 711 is shielded from being coated with the molded material. The shielding is not shown here.

Figure 2:
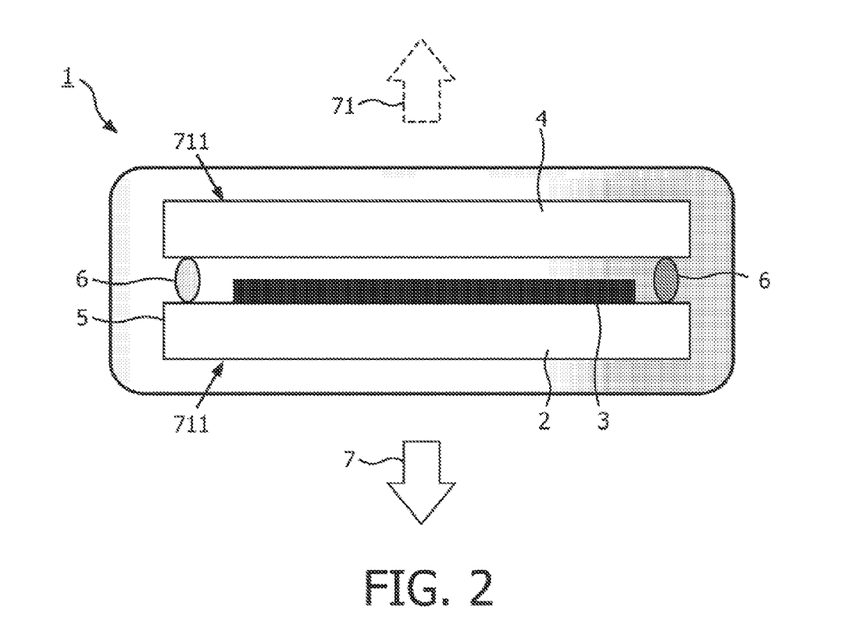
FIG. 2: OLED device according to the present invention fully covered with a transparent protection cover in a side view

FIG. 2 shows an alternative embodiment of an OLED device 1 according to the present invention, where a transparent protection cover 5 (e.g. silicone, polyurethane or PMMA as the moldable material) fully encloses the OLED structure. Due to the transparent protection cover 5, the OLED device could be manufactured as a so-called transparent OLED using a transparent substrate (e.g. glass), a transparent encapsulating cover (e.g. glass) as well as transparent substrate electrode and back electrodes (not shown in details here). Such a transparent OLED device 1 comprises two light emitting surfaces 711, where the light 71 is additionally emitted through the encapsulating cover 4.

The shape of the protection covers 5 of the embodiments shown in FIGS. 1 and 2 provide an additional gas barrier to the OLED structure to improve the sealing quality, e.g. of the gastight glass frit 6.

Figure 3A:
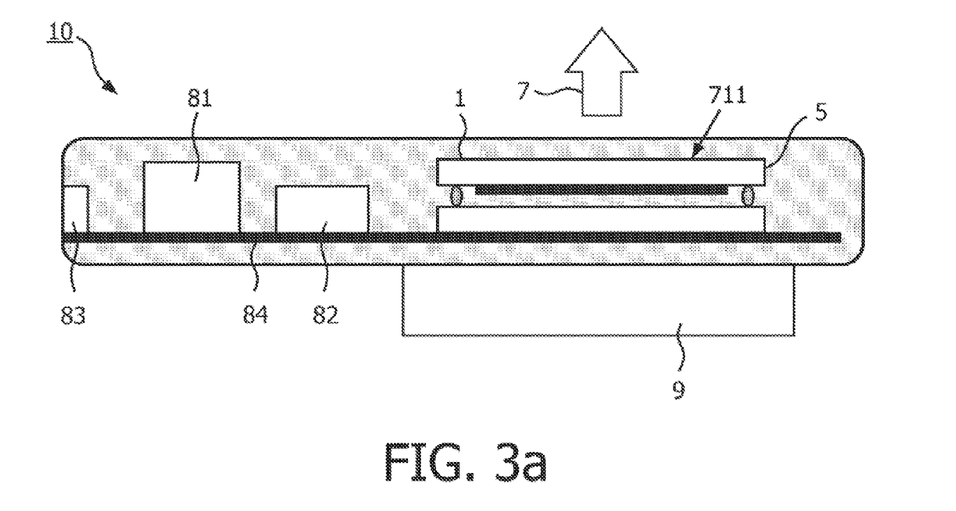
FIG. 3: OLED system according to the present invention fully covered with a transparent protection cover in (a) side view and (b) front view
Figure 3B:
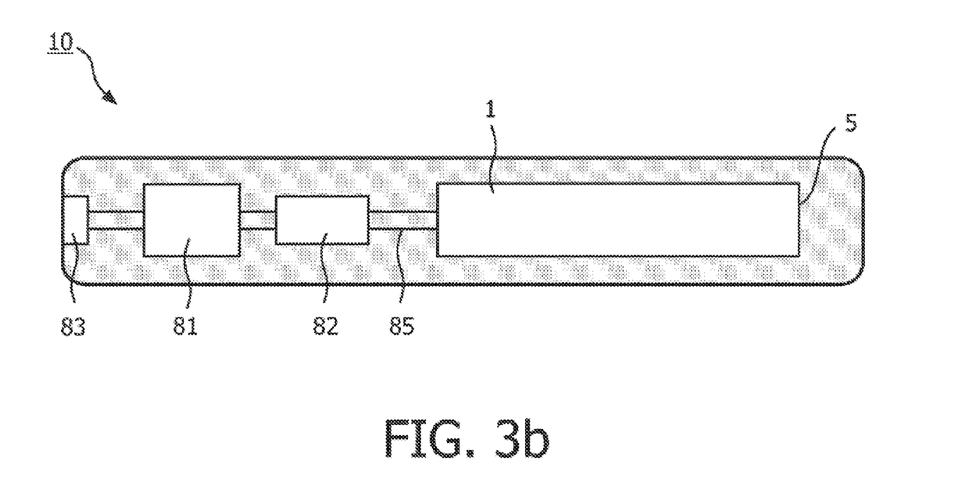

FIG. 3 shows an example of an embodiment of an OLED system 10 according to the present invention (a) in a side view and (b) in a top view, where the OLED device 1 together with the electrical components such as electronic driver 81, driver controller 82, electrically conductors on top of a rigid support 84 and electrical contacts 83 are covered by the protection cover 5. The electrical contacts 83 are partly free of protection cover 5 in order to be connected to a power source to drive the OLED system 10. Below the OLED device 1, a cooling body 9 is arranged in order to dissipate the heat generated during OLED device operation away from the OLED device 1. Therefore the protection cover 5 may comprise second additives in order to increase the thermal conductivity of the material of the protection cover 5. Suitable second additives may be metal ribs and/or metal particles. The top view onto the light emitting surface 711 is shown in FIG. 3b. The electrical connectors 85 to connect the OLED device 1, the driver and controller 81, 82 and the electrical contact 83 are shown schematically in FIG. 3b.

People skilled in the art may consider other or more electrical components as part of the OLED system compared to the shown embodiment within the scope of this invention. Also the shape of the OLED system 10 might be different to the rectangular shape shown in FIG. 3. Alternatively, multiple modular connected OLED systems 10 according to the present invention may be arranged in rows and/or arrays. The shape of the OLED system and/or the OLED device may be essentially two-dimensional (like sheets) with OLED devices being mounted in a random or defined order. With OLED devices 1 arranged in a matrix distribution (or an OLED system with such OLED device arrangement), the controlling could be by multiplexing the control signals. However, fully encapsulated OLED systems 10 can be distributed and/or mounted as one-piece device.

Alternatively to a two-dimensional shape, the OLED device 1 and/or OLED system 10 may have a three-dimensional shape, if the protection cover 5 is prepared in the required thickness and shape. Non-molded-in OLED devices and/or OLED systems having a three-dimensional shape may be covered with a protection cover, either thick or thin depending on the demands. The rigid support 84 shown in FIG. 3 may be a flexible support in alternative embodiments, where the protection cover 5 provides a desired stiffness to the flexible support 84. A shape (or body) is denoted as three-dimensional, if the shape (body) differs from a sheet-like appearance. A sheet-like appearance is denoted as two-dimensional shape, e.g. when the height of the body is very small in comparison to the dimensions in length and depth.

Two examples of applicable molding processes are described in the following:

Casting Process:
  Placing the OLED device or the OLED system in a molding volume (form) adapted to the desired OLED shape with applied protection cover. The molding volume comprises suitable fixation means to carry the OLED device/system in the required position. Depending on the process, parts of the OLED device/system may be shielded to be not covered with protection cover, e.g. electrical contacts for subsequent connecting to a driver or a power source. Preferably, the shape of the form provides the shielding itself, e.g. the to-be-shielded parts of the OLED device/system are in direct contact to the inner surface of the form and therefore shielded against coating with the protection cover.
  Placing the form into a vacuum chamber.
  Providing polyurethane in liquid form in the vacuum chamber.
  Applying the protection cover by casting the polyurethane into the form, preferably with a constant flow of polyurethane, to mold-in the OLED device or the OLED system at room temperature (denoted as mold).
  Leaving the mold in the vacuum chamber for a period until the polymerization of polyurethane is finished for ~90%. The further polymerization may continue after the product is removed from the vacuum chamber or form. For the current product we are using ~24 h time of polymerization before removing the molded-in OLED device/system from the form. In this way the process temperature can be very close to room temperature, for instance below 50° C.

Alternatively the molded-in OLED device/system could be removed from the vacuum chamber direct after the filling is finished in case of use of moldable materials with a faster polymerization in order to become rigid. However, a faster polymerization (exothermic chemical reaction) results in higher process temperatures. The casting process may be alternatively performed without the use of a vacuum chamber. In a preferred embodiment, the form is made of a material with a high thermal conductivity (e.g. metal) and may be additionally cooled (e.g. water cooled) to lower the process temperature.

Thermoplastic/Thermosetting Process

Moldable material such as polycarbonate or PMMA in form of granulate is melted in an injection molding machine well above the glass-transition-temperature ~250° C. The OLED device or OLED system is placed in a molding volume (chamber) which has a temperature well below the glass-transition-temperature of 50-60° C. The plastified granulate is then injected into the chamber with a pressure equal, essentially equal or above atmosphere pressure (depending on the molding process). The injection time normally is ~1-2 seconds. After the chamber is filled with polycarbonate or PMMA, the pressure is maintained to ensure that the chamber is completely filled without voids. After holding (cooling) for 10-15 second (depending on the chamber size), the molded material became rigid. Then the chamber is opened and the OLED device or OLED system can be released from the chamber.

These processes are only two possible examples to apply a protection cover made of a moldable material to an OLED device or an OLEDsystem. People skilled in the art may vary the applied process temperatures, pressures, duration and moldable materials within the scope of this invention Protection covers made of moldable materials are rigid covers. For instance, a protection cover made of polyurethane exhibits a hardness of shore D.

Figure 4:
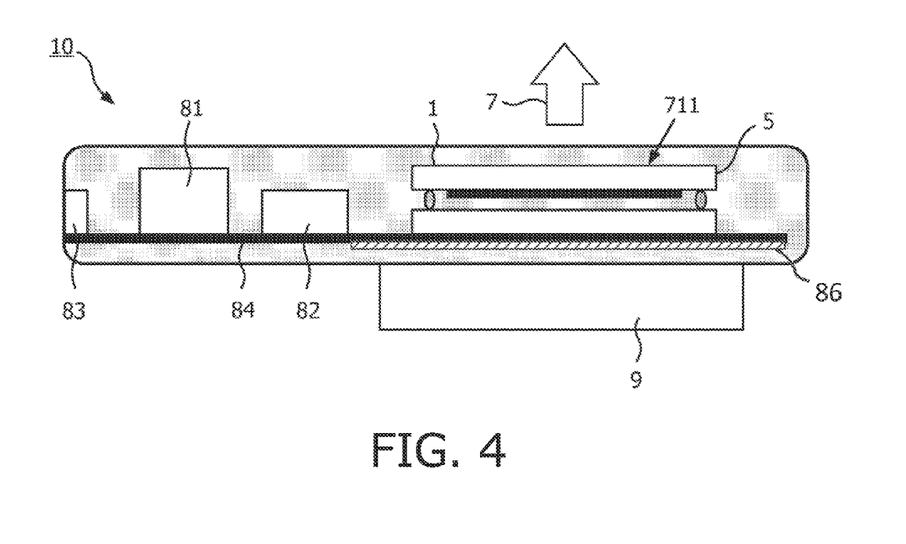
FIG. 4: OLED system according to the present invention fully covered with a transparent protection cover and including a stiffening rib in a side view.

The protection cover may comprise first and second additives to modify the optical appearance or the out-coupling properties of the emitted light or the mechanical or thermal properties of the OLED device and/OLED system. The first and second additives may be filler material added to the mold of plastic material. However, the filler-grad (content of the additives) will be low. The purity of the materials used for the molding process implies that the stiffness of the materials is limited and mechanical robustness and stiffness can be improved by adding stiffening ribs 86 to the protection cover and/or to the OLED system, e.g. to the rigid support as illustrated in FIG. 4. The molding process makes it possible to include any material to the OLED system before molding of the OLED system takes place. In this way materials can be added to improve the stiffness and the mechanical robustness of the OLED system, e.g. by adding metal rods, metal profiles, wood sheets, wood beams. Additionally, further sheets or covers may be applying over the parts of the OLE devices and/or OLED systems, which should not be visible to the outside in case of applying a transparent protection cover, e.g. design foils, fabrics, wood veneers or metal sheets. Alternatively a second molding step applying another molded layer with other optical properties as the protection cover 5 may be locally present on the OLED device and/or OLED system. It might be desired to cover parts of the OLED system, while a transparent protection cover has to be applied for optical reasons and/or process simplifications, e.g. for avoiding shielding masks for the emission surfaces.

The shown embodiments must not be considered as a limitation of the invention. The discussed embodiments are only examples of the present invention. People skilled in the art may consider alternative embodiments of the previously disclosed invention still falling into the scope of this invention

LIST OF REFERENCE SIGNS

1 OLED device according to the present invention
10 OLED system according to the present invention
2 Substrate
3 light emitting layer stack
4 encapsulating cover
5 protection cover
6 sealing material to seal the encapsulating cover to the substrate
7 emitted light through the substrate
71 emitted light through the encapsulating cover
711 light emitting surface of substrate and/or encapsulating cover
81 electronic driver(s)
82 electronic driver controller(s)
83 electrical contact(s)
84 rigid support
85 electrical connectors
86 Stiffening rib(s).
9 cooling body

The invention claimed is:

1. An OLED device comprising a light emitting layer stack on top of a substrate encapsulated by an encapsulating cover, at least the edges of the substrate and the encapsulating cover being covered with a protection cover comprising a moldable material, wherein said protection cover additionally covers at least one other electrical device that is disposed on an area of an electronic board that is different from an area of the electronic board on which said substrate and said encapsulating cover are disposed.

2. The OLED device according to claim 1, wherein the substrate and the encapsulating cover are made of glass.

3. The OLED device according to claim 1, wherein the moldable material is at least one of polyurethane, silicones, epoxies, polymethylmethacrylate, polycarbonate or acrylic based plastics.

4. The OLED device according to claim 1, wherein the protection cover is at least partly transparent.

5. The OLED device according to claim 4, wherein protection cover fully encloses the substrate and the encapsulating cover, while providing at least two non-covered electrical connections to operate the OLED device.

6. The OLED device according to claim 4, wherein the moldable material comprises first additives to achieve optical effects.

7. The OLED device according to claim 6, wherein the moldable material comprises second additives to increase the stiffness and/or the thermal conductivity of the protection cover.

8. An OLED system comprising at least one OLED device according to claim 1 and the electronic board connected to the at least one OLED device by suitable connectors, the system further comprising a cooling body thermally connected to the OLED device.

9. The OLED system according to claim 8, wherein the electronic board and the suitable connectors are also at least partly covered by the protection cover.

10. The OLED system according to claim 9, wherein the protection cover fully encapsulates all components of the OLED system, while providing suitable non-covered electrical contacts to connect the OLED system to a power source.

11. The OLED system according to claim 10, wherein one of the components of the OLED system are stiffening ribs to improve the mechanical robustness of the OLED system.

12. The OLED device according to claim 1, wherein said at least one other electrical device is at least one of an electronic driver or a driver controller.

13. An OLED system comprising:
an OLED device including a light emitting layer stack on top of a substrate encapsulated by an encapsulating cover, at least the edges of the substrate and the encapsulating cover being covered with a protection cover comprising a moldable material a circuit board on which said OLED device is disposed, said circuit board including at least one other electrical device, wherein said protection cover additionally covers the at least one other electrical device, which is disposed on an area of the electronic board that is different from an area of the electronic board on which said substrate and said encapsulating cover are disposed.

14. The OLED system of claim 13, wherein said at least one other electrical device is at least one of an electronic driver or a driver controller.

* * * * *